(12) United States Patent
Breton et al.

(10) Patent No.: US 6,859,375 B2
(45) Date of Patent: Feb. 22, 2005

(54) FAST ANALOG SAMPLER WITH GREAT MEMORY DEPTH

(75) Inventors: Dominique Breton, Queyrac (FR); Eric Delagnes, Chaville (FR)

(73) Assignees: Centre National de la Recherche Scientifique, Paris (FR); Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/475,222

(22) PCT Filed: Apr. 24, 2002

(86) PCT No.: PCT/FR02/01409

§ 371 (c)(1),
(2), (4) Date: Oct. 20, 2003

(87) PCT Pub. No.: WO02/089145

PCT Pub. Date: Nov. 7, 2002

(65) Prior Publication Data

US 2004/0114409 A1 Jun. 17, 2004

(30) Foreign Application Priority Data

Apr. 26, 2001 (FR) .............................. 01 05607

(51) Int. Cl.⁷ ............................................... G11C 27/00
(52) U.S. Cl. .................... 365/45; 365/189.12; 365/194
(58) Field of Search .............................. 365/45, 189.12, 365/194, 233

(56) References Cited

U.S. PATENT DOCUMENTS

| | | | |
|---|---|---|---|
| 4,037,119 A | 7/1977 | Schat | |
| 4,399,518 A | * 8/1983 | Bardl | ........................ 365/45 |
| 4,811,285 A | * 3/1989 | Walker et al. | ............... 365/45 |
| 5,144,525 A | 9/1992 | Saxe et al. | |
| 5,526,301 A | 6/1996 | Saxe | |
| 5,963,063 A | 10/1999 | Sugihashi | |
| 6,097,232 A | 8/2000 | McKinney | |

FOREIGN PATENT DOCUMENTS

EP   0 350 027   1/1990

* cited by examiner

*Primary Examiner*—Huan Hoang
(74) *Attorney, Agent, or Firm*—Oblon, Spivak, McClelland, Maier & Neustadt, P.C.

(57) ABSTRACT

An analog sampler for recording analog data carried by a bus includes an array of recording cells arranged in rows and columns. Each cell has an analog input coupled to the bus by a switch having a controlling digital input. A delay line is associated with each column, coupled to a shift register. Successive outputs of the line are coupled to each of the digital inputs of the cells of the column such that at any moment there is no more than one switch of a single recording switch. The signal is thus not disrupted by noise.

18 Claims, 6 Drawing Sheets

FAST ANALOG SAMPLER WITH GREAT MEMORY DEPTH

TECHNICAL FIELD

The invention relates to the field of high rate analog samplers having high memory depth and variable sampling frequency.

PRIOR ART

U.S. Pat. No. 5,144,525 granted on Jan. 9, 1992 discloses an acquisition system for acquiring an analog signal comprising a matrix array of capture cells of an analog signal circulating on an analog bus. In the description of the prior art analog matrix array of this patent, it is explained that a cell of the array is selected for writing of an analog value by means of two shift registers. A first register in a first direction Y defines the row of the write cell. A second register in a second direction X defines the column of the write cell. The write cell is thus situated at the intersect of the selected row and the column. It is explained that the maximum sampling rate of this array of the prior art is defined by the maximum clock rate of one of the two shift registers.

U.S. Pat. No. 5,144,525 proposes, to augment the sampling rate relative to this prior art device, a device comprising as already well-known an array 10 of capture cells 16 of an analog signal. Selection of the row R of the write cell is always done in the direction Y by a first shift register 18. Selection of the column C of the write cell is, itself, done by means of a delay line 22 equipped with successive outputs.

Each of the cells 16 is equipped by means of a write-in command, for example in the form of an AND gate 24, whose two inputs 32, 34 receive one the signal coming from the shift register 18 controlling the rows and the other receiving the signal coming from one of the outputs from the delay line 22. The output of the AND gate controls the gate of a field effect (FET) transistor 26. When the field effect transistor (FET) is conducting, the signal to be sampled coming from the analog bus 12 is directed by means of the drain—source path of the transistor to a capture capacitor 30 connected between the ground and the output 28 making possible subsequent read-out.

Using this type of device, the sampling rate is no longer limited by the clock rate of a shift register but by the length of the delay for one control signal to propagate from one output to the other of the delay line controlling the columns. It is indicated at the top of column 4 of this patent that the propagation duration of the control signal of the delay line 22 can be of the order of 500 picoseconds, resulting in gigahertz sampling rates.

A first example of read out circuitry is described in column 10 lines 10–24 with reference to FIG. 19 of U.S. Pat. No. 5,144,525. Each output 28 of a capture cell 16 opens onto a buffer stage 94 having an enable input 96. The voltage on the output column 101 of the buffer stage 94 of a line is sequentially selected by the multiplexer 102, which serially delivers the outputs of a current line, then the next one until complete read-out of all of the capture cells 16 of the array.

For proper functioning of this type of device it is important that the selection switching of the row takes place at the instant where the write in of a current row is ended. Accordingly, all of the capture cells of a current row have been written and one can go on to the next row. Poor synchronization between the end of write-in of a current row and passing on to the following row, triggered by the shift register 18, results in having recording overlaps between the end of the current row and the beginning of the following row, if the path to the following row occurs too soon or it results in gaps in the sequence of samples if the path to the next row occurs too late.

In the two cases the subsequent read out of the signal will be incorrect due to erroneous evaluation of the time lapsed between successive samples for certain sample series or because of lack of samples.

It should be noted at this point that this type of error in signal recording, even at low rates, involves significant errors in a Fourier transformation of a recorded signal.

In order to regulate the transit time in the delay line 22 so that it may be exactly equal to the path time from one output to the following one, this prior art document provides for a regulation of the delay contributed by the series of buffer stages 62, which together forms the delay line 22. Column 8 starting at line 20, describes this regulation that comprises a coincidence detector receiving at one input A the end of row signal, on an input B the clock signal from the shift register 18. A difference between these two signals is translated by a voltage difference that is used for regulating an operating voltage of each of the buffer stages 62.

In spite of this precaution, it is not impossible for the synchronization defect indicated above to occur. It should also be noted that this type of device, in virtue of its operating principle, generates considerable noise, which itself is of a nature to seriously increase the value of the signal-to-noise ratio of the recorded signal. This noise is due essentially to the fact that the switching for the path from one capture cell to the following one is done over the entire column comprising this cell.

It should be noted in order to facilitate the comparison with the description of the invention that follows that it amounts to same thing if the shift register is installed parallel to the direction X perpendicular to the columns.

U.S. Pat. No. 5,526,301 also discloses a data acquisition system comprised of 100 acquisition cells arranged in 10 rows and 10 columns. The capture cells are represented at reference 52 of FIG. 5 of this patent. FIG. 2 of this patent represents the control means at the start and at the end of sampling for each of the cells 52.

On examination of FIG. 2 in conjunction with the description, it is understood that the end of sampling of the cell 52 situated at the intersect of the first row and the first column is controlled by a signal $X_{00}$. The $X_{00}$ signal is equivalent to an $X_0$ signal but shifted in time by a delay $D_{00}$. The $X_0$ signal is a signal obtained at the first output of a shift register 28. The propagation of the $X_0$ signal across delay elements $D_{00}$ to $D_{09}$ thus successively controls the successive ends of sampling via flip-flops 50 represented in FIG. 5. These samplings of the cells 52 of the second column are also controlled by a signal $X_1$ which has, relative to the signal $X_0$, a delay corresponding to one clock period of the shift register 28. It is continued in this fashion up to the tenth column, to which the signal $X_9$ corresponds. The start of sampling is controlled by the signal $X_6$ or $X_B$ coming from an eleventh or a twelfth output, respectively, of the shift register 28. The question of the synchronization between the end of the sampling in one column and the start of sampling in a following column is not broached in this patent. It is also noted that, because of the common distribution to a plurality of columns simultaneously of the sampling start signal the sampling delay is variable for the different cells 52, which contributes to distorting the sampled signal. In addition, the number of cells in the process of being sampled varies widely over time, which involves permanent variations of the pass-band of the system over time. These variations also contribute to the distortion of the sampled signal.

BRIEF DESCRIPTIONS OF THE INVENTION

With regard to the state of technology that has just been described, in the one or the other of the cited documents, the invention provides a recording and read-out device having an improved signal-to-noise ratio, greater regularity of recording, each of the samples being recorded at the defined instant and place.

It is an FISO (fast-in slow-out) device of great depth at variable sampling rate that is capable of reaching or exceeding GHz. In this type of device, write-in is fast so as to reliably sample wideband signals and read-out is done on an enlarged time scale. The read-out time is thus discretely superior to the write-in time.

As in the prior art, the capture array is comprised of an assembly of cells arranged in rows and columns. A column write pointer comprised of an output signal from a shift register defines the write column. The invention differs from the prior art described in one or the other of the two patents cited above by one or a plurality of characteristics that can be combined with the prior art described in one or the other of the two patents cited above, one to one or according to any combination of these different characteristics.

Each write column of a sampler according to the invention is equipped with a delay line having at least as many delay elements as there are rows in the matrix array.

The write column is defined by a signal present at the output of a shift register. The write cell in this column is defined by an output of a signal from the delay line associated with this column. The start and end signals for sampling both come from said delay line. In this fashion, for each sampling, only the cell of the write column chosen by the delay line can be switched. This means that sampling is commenced by a following cell only after the start of sampling of a preceding cell. The same applies to the end of sampling, which takes place only after the end of sampling of a preceding cell. This first inventive characteristic makes it possible to minimize the write noise, assuring equal and constant times among cells for sampling of each of the cells, and guarantees that the number of cells in sampling phase is constant and distortion of the sampled signal is considerably reduced. This first inventive characteristic will be described more fully in the following.

According to a second characteristic that can be combined with the prior art described in the one or the other of the two patents cited above or with the prior art modified according to the first characteristic, the matrix array of the write cells and the read-out cells can be folded. A definition of what is understood by folded matrix array and an embodiment of such a folded array will be given in the following.

According to a third characteristic that can be combined with the prior art described in the one or the other of the two patents cited above or with the prior art modified according to the first characteristic or according to the second characteristic or can even be combined with the prior art and the two first characteristics, an analog bus carrying the signal to be recorded is divided into as many divisions as there are rows in the matrix array and each of the said divisions carries a self-orienting amplifier receiving the signal to be recorded and bringing it to a level that is sufficient for being recorded.

According to a fourth characteristic that can be combined alone with the prior art described in the one or the other of the two patents cited above or with one or with several of the characteristics already cited, each cell of the matrix array incorporated in a sampler according to the invention comprises at least two write switches. The first write switch is connected to a hot part of the write bus and the second write switch is connected to a cold part or return of this same write bus. At the time of connection of the write bus, the sequence of actuation of the switches is of little significance. In contrast, at the time of disconnection of the cell relative to the write bus, according to one important characteristic, the switch connecting the cell to the cold part or return of the write bus must be actuated first. So that this condition may be satisfied, it is sufficient that a control of this switch receives a disconnect signal a short time before the second switch that connects said cell to the hot part of the write signal receives its own disconnect signal. The cold part of the write bus being, for example, connected to ground, it has no affect on the value recorded regarding the sampling value.

Finally, according to a fifth characteristic, the recorder is a differential recorder. It comprises a first bus having an input coupled to a first source supplying the signal to be recorded at a first polarity and a second bus having an input coupled to a second source supplying the signal to be recorded at a second polarity that is the inverse of the first. The two buses are divided in order to form divisions. The matrix of cells is organized into pairs of consecutive rows. The first row of a pair is connected to a division of the first bus; the second row is connected to a division of the second bus. The rows of a pair being consecutive, the moments of sampling of the cells of the pair of rows belonging to the same column can be almost simultaneous.

This fifth characteristic that is described in the following can be, as in the case of each of the other four, combined with the prior art described in the one or the other of the two patents cited above or with the prior art, improved by one or a plurality of the four other characteristics.

In the sampler according to the invention, selection of a column determines the choice of a first write cell; for example, the cell situated in said selected column and in the first row. Writing in the first cell of said column is made possible, because a write bus carrying the signal to be recorded is connected by a switch controlled on opening and closing. The control of this first switch is effected using the signal at the output of the column selection shift register. This control signal is transmitted by a delay line to a write switch of the following write row and so on until reaching the last of the recording rows of the matrix array. Accordingly, each of the columns of the matrix array is equipped with a delay line comprising as many outputs as rows of the matrix array. The output signal of a delay line controls the selection of a single cell and induces capture start switching or capture end switching of the sample for this cell alone. Accordingly, one prevents a switching noise with a high repetition rate and thus broad spectrum from being diffused into all of the matrix array and perturbing the signal to be recorded. In addition, by the principle of production itself, one is assured that the instant of sampling of a current cell takes place only after the instant of sampling of a preceding cell, since there is uniqueness of the cell that can be sampled.

In summary, the invention relates to a sampler for recording analog data relative to a signal comprising as described in the prior art:

at least one analog bus carrying the signal to be recorded;

a matrix array of capture and recording cells arranged in rows and columns, each of the cells having at least one analog input coupled to at least one analog bus and at least one digital input, each of the: columns having one column input coupled to a digital input of each cell of said column, a write-in shift register having an entry for receiving a clock signal and a plurality of shifted outputs coupled to the matrix array column inputs.

The sampler comprises, for each column, an associated delay line having an input of the delay line and shifted serial outputs in a number equal to or greater than the number of rows of the matrix array, the input of the delay line being the column input, the column input being coupled to one of the digital inputs of the cells of the column by means of said delay line, each delay line being formed by a series of elementary delays, a first delay coupled to a digital input of a cell of the first row, each of the following elementary delays coupled biunivocally to a digital input of a cell of one of the following lines, and a last elementary retard coupled to a digital input of a cell of a last line, said sampler being characterized in that said one cell digital input coupled biunivocally to one of the elementary delays of said delay line is successively the command input of the start and of the end of a sampling operation for said cell.

Thus there is a biunivocal correspondence between the outputs of the delay line and a digital input of the capture and recording cells.

According to an important alternative of this embodiment, the sampler comprises, at least for a delay line associated with a column or for a supplemental delay line, a phase comparator receiving a signal from said delay line on a first input and a reference signal on a second input, at least one output of said phase comparator being coupled to a charge pump, whose one output is coupled to means controlling a regulatory voltage of the elementary delays. This characteristic assures that the start and the end of the sampling operation of the last cell of a column and the first cell of the following column are consecutive in the same fashion as the cells of a same column.

As will be seen in the following, in a preferred embodiment the analog signal to be recorded is presented differentially using a bus carrying the positive side Vin+ of the input signal and a bus carrying the negative side Vin− of the input signal.

It will also be seen that the digital write inputs of each cell can be two in number; a sampling input and a validation input.

According to the second characteristic, the invention relates to a recording sampler for analog data relative to a signal comprising, as in the prior art represented by one or the other of the two patents cited above:

at least one analog bus carrying the signal to be recorded;

a matrix array of capture and recording cells arranged in rows and columns, each of said cells having at least one analog entry coupled to at least one analog bus and to the at least one digital input, each of said columns having a column input coupled to a digital entry of each cell of said column;

a write shift register having an input for receiving a clock signal and a plurality of shifted outputs coupled to the column inputs of the matrix array.

According to the second characteristic improving the prior art of the sampler, it is characterized in that the matrix array of recording cells is folded upon itself, the write shift register comprising a 180° bend thus forming an outbound part situated in front of the bend and a return part situated after the bend, columns coupled at outputs of the write shift register situated on the return part being intercalated between columns coupled to outputs of the write shift register situated on the outbound part.

According to the third characteristic, the invention relates to a recording device for analog data relative to a signal comprising:

at least one analog bus carrying the signal to be recorded;

a matrix array of capture and recording cells arranged in rows and columns, each of the cells having at least one analog input coupled to the at least one analog bus and at least one digital input, each of the columns having a column input coupled to a digital input of each cell of said column;

a write shift register having an input for receiving a clock signal and a plurality of shifted outputs coupled to the column inputs of the matrix array the sampler is characterized in that the analog input bus is divided for supplying divisions, each division corresponding to a row of the matrix array and each of these divisions carrying preferably a self-orienting amplifier.

According to the fourth characteristic, the invention relates to a recording sampler for analog data relative to a signal comprising:

at least one analog bus carrying the signal to be recorded;

a capture and recording cell matrix array arranged in rows and columns, each of the cells having at least one analog input coupled to at least one analog bus and to at least one digital input, each of the columns having one column input coupled to a digital input of each cell of said column, each cell of the array comprising a capacitor having two terminals studs, a first and second terminal, the first terminal being coupled by means of a first switch that can be controlled by one of the divisions of the bus, the sampler is characterized in that the second terminal is coupled to a return part of the bus to constant potential by means of a controllable second switch, the second switch of each cell having a control input connected upstream of a delay means controlling the opening of the first switch in such a fashion that the second switch is always open before the first switch.

According to the fifth characteristic of the invention, the recording sampler for analog data relative to a signal according to the prior art represented by one or the other of the two patents cited above or described in conjunction with one or a plurality of the inventive characteristics cited above and characterized in that it comprises two analog input buses, a first one intended to be connected to a source of the signal to be sampled at a first polarity, a second one intended to be connected to a polarity reverser receiving the signal to be sampled and supplying a signal to be sampled at a second polarity the inverse of the first, the two input analog entry buses being divided for supplying divisions, each division corresponding to a row of the matrix array, the rows being arranged in pairs of consecutive rows, each pair of rows comprising an odd ranking row of the matrix array and an even ranking row of the matrix array, the rows of a pair having consecutive rankings, each row of the odd ranking having its cells coupled to a division of the bus carrying the signal of the first polarity and each row of the even ranking having its cells coupled to a division of the bus carrying the signal of the second polarity.

Preferably each of the divisions carries a self-orienting amplifier.

Finally, the invention also concerns a method for capturing analog samples such as mentioned hereinbefore in the claims of the method found at the end of the present application.

BRIEF DESCRIPTION OF THE FIGURES

Other features and advantages of the invention will become apparent when reading the exemplary descriptions of embodiments and alternatives that will be given hereinafter with reference to the appended figures, wherein.

In addition, a table is appended to the present description that represents the values of a row validation word.

DETAILED DESCRIPTION OF EXEMPLARY EMBODIMENTS OF THE INVENTION

Figure 1:
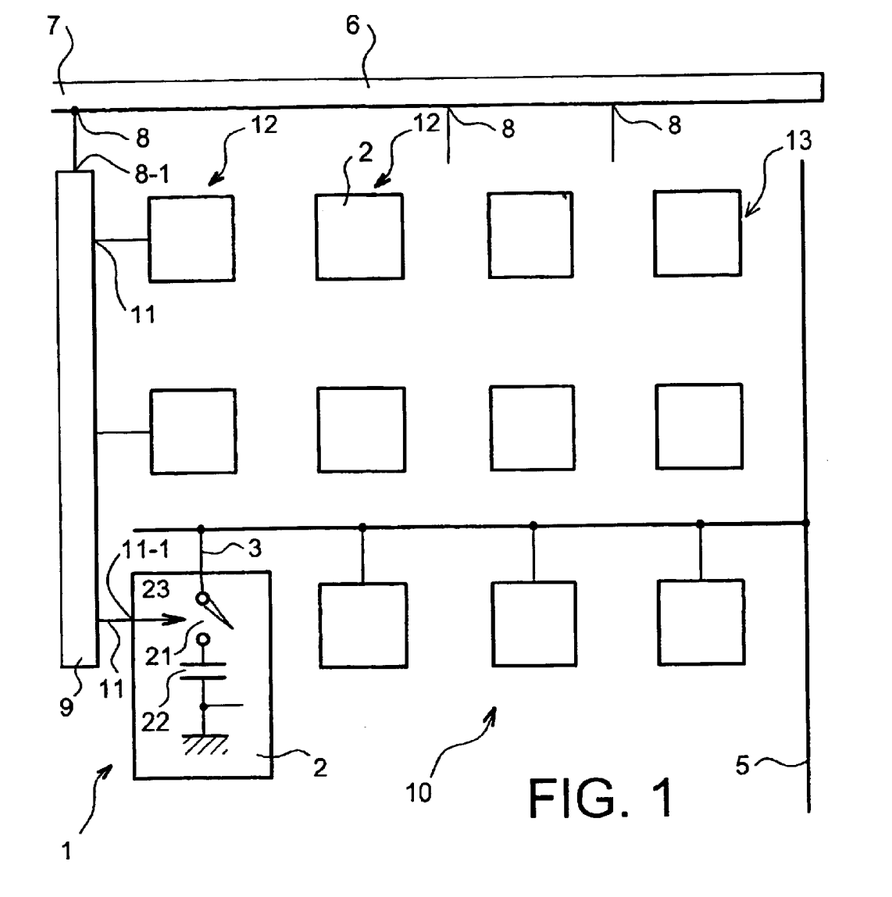
FIG. 1 is a diagrammatic representation of the most general embodiment of the invention according to its first characteristic.

FIG. 1 diagrammatically represents a recording device 1 according to the invention. This device comprises a matrix array 10 of cells 2 comprised of a preferably even number L of rows each referenced with 13 and a number C of columns each referenced with 12. The number of cells 2 is thus equal to L×C. Each of the cells 2 has an analog input 3 connected to an analog bus 5. In order to simplify the figure, in FIG. 1 only the connection to the bus 5 of the cells of the last line is represented. A column write shift register 6 has an input 7 coupled to a source (not shown) of a clock signal supplying a signal at a so-called main frequency Fp. This shift register 6 has serial outputs 8. Each output 8 of the write register 6 is coupled to an input 8' of a delay line 9. The delay line 9 has a number L or 2L of serial outputs 11 at least equal to the number of rows of the matrix array 10 of cells 2. In FIG. 1, in order to simplify the figure, one single delay line 9 is shown but it must be understood that similar delay lines 9 are associated with each column of the matrix array of cells 2, such that in total there are at least C delay lines 9. It will be seen in the following that in one of the embodiments there can be an additional delay line dedicated to the control of the transit time of the set of delay lines. All of the cells 2 are similar. Because of the simplifications applied to the representations, only the cell 2 situated in the lower left corner of the matrix array of cells 2 is represented with a digital command input 11-1 connected to the output 11 of the delay line 9 and with its analog input 3 connected to the bus 5. It must, however, be understood that the same applies to all of the cells 2. In order to illustrate details of each cell 2, the cell 2 situated in the lower left corner of the matrix array of cells 2 is represented on an enlarged scale relative to the other cells.

Each cell 2 comprises first switching means represented in the form of a first controllable switch 21 and a capture capacitor 22, having one terminal connected to the switch 21. The other terminal of the switch 21 is connected to the analog bus 5. The control 23 of the switch 21, symbolized by an arrow, is connected to the digital input 11-1 of the cell 2.

Operation is as follows:

A column write pointer of a duration equal to 1/Fp, for example, introduced via input 7 of the register 6 is propagated at a frequency Fp in said shift register 6 of C outputs 8. The output signal of each of the outputs 8 of this register is coupled to the delay line 9 comprising L delays, each of a duration of 1/(L×Fp). The output signal of each of the delays comprises the control 23 of the write switch 21 in one of the capacitors 22 of the matrix array. Accordingly the signal issued from a delay i of column j makes it possible to record the value of the sample of the analog signal in the memory cell 2 i, j, situated at the intersection of the row i and column j. i and j are numbers between 1 and L and 1 and C, respectively.

The device 1 thus makes possible carrying out sampling of an analog signal with a virtual period of 1/(L×Fp), which corresponds to a maximum sampling rate Féch=L×Fp. If each of the individual delays between consecutive outputs 11 of the delay line 9 is, for example, of the order of a nanosecond, one can also obtain sampling rates of the order of GHz using a clock signal Fp at 50 Mz.

According to an optional advantageous characteristic of the invention making it possible to reduce the sampling rate, means make it possible to validate or inhibit write commands output of all of the individual delays of a row. If inhibition is regular, for example, one out of two rows, or two out of three rows, the corresponding sampling rates Fet will be divided by two or by 3, respectively. The sampling rate can also be divided by a small number m. For reasons that will be explained further on in the description, it is preferable that the divisor m of the sampling rate be also an integer divisor of the number of rows L. Accordingly, it is recommended that a number L be chosen that has a large number of integer divisors, for example L=20, which can be integrally divided by 1, 2, 4, 5 and 10.

The embodiment that hereinbefore has been described in conjunction with FIG. 1, has the following advantages:

in the circuitry there is no frequency signal greater than Fp even when the sampling rate is greater than Fp;

This characteristic makes it possible:

to limit the perturbations of analog signals by digital controls;

to diminish the dissipated power.

Figure 2:
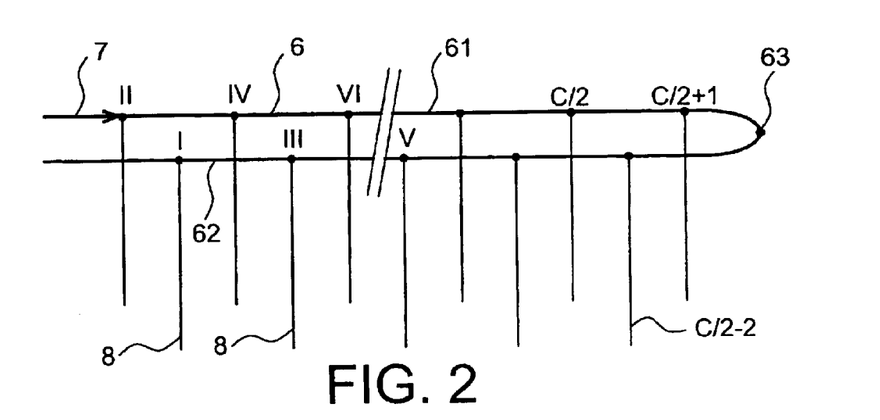
FIG. 2 is a diagrammatic representation of a method of physical arrangement of the columns of a matrix array in which the array is folded.

According to one embodiment, diagrammatically represented in FIG. 2, intended to prevent discontinuities due to edge effects, in particular those connected with propagation times, the matrix array 10 of recording cells 2 is folded onto itself. The shift register (6) comprises a 180° bend 63 thus forming an outbound part 61 situated before the bend and a return part 62 situated after the bend. Columns 12 and their associated delay lines 9 coupled to outputs 8 of the write shift register 6 situated on the return part 62 are intercalated between columns 12 and their associated delay lines 9 coupled to outputs 8 of the write shift register (6) situated on the outbound part 61.

The write pointer initially in the first part 61 of the column write register 6 goes left to right up to the 180° bend 63. The outputs 8 of this first part 61 are coupled to a first part of the columns 12, for example to the columns 12 physically of even ranking. At the entry, in this example, in column having rank C/2 of the register, corresponding physically to the penultimate column of the matrix array, the pointer will pass to the next column 12 physically of odd ranking. The write pointer will then retrace its steps by returning to the left over all of the columns physically of odd ranking. In FIG. 2 the shift register 6 has been diagrammatically represented by a horizontal line running from left to right then from right to left. Each of the columns 12 comprised of a delay line 9 and L cells 2 has been symbolized by a vertical line having an odd or an even ranking. The first columns physically of even ranking 2, 4, 6, . . . C/2 and the column physically of odd ranking (C/2+1) are on the path 61 of the shift register 6 running from left to right. The last columns 12 physically of odd ranking (C/2−1), (C/2−3) . . . 3, 1 are on the path 62 of the shift register 6 running from right to left. In FIG. 2 the column rankings are indicated in Roman numerals in order to distinguish them from the other reference symbols indicated in Arabic numerals. Each column 12 physically of odd ranking with the possible exception of a first or a last one is thus situated between two columns of even ranking. The direction of path of the columns 12 for the recording process goes with this physical disposition of the columns in the direction of the increasing even rankings then in the direction of the decreasing odd rankings.

Several particularities of the matrix array 10 will now be described with reference to FIGS. 3 and 4 that each represent a folded matrix array 10, as has just been described above but in the representation of FIGS. 3 and 4, the array 10 is represented unfolded in order to simplify the figures.

Figure 3:
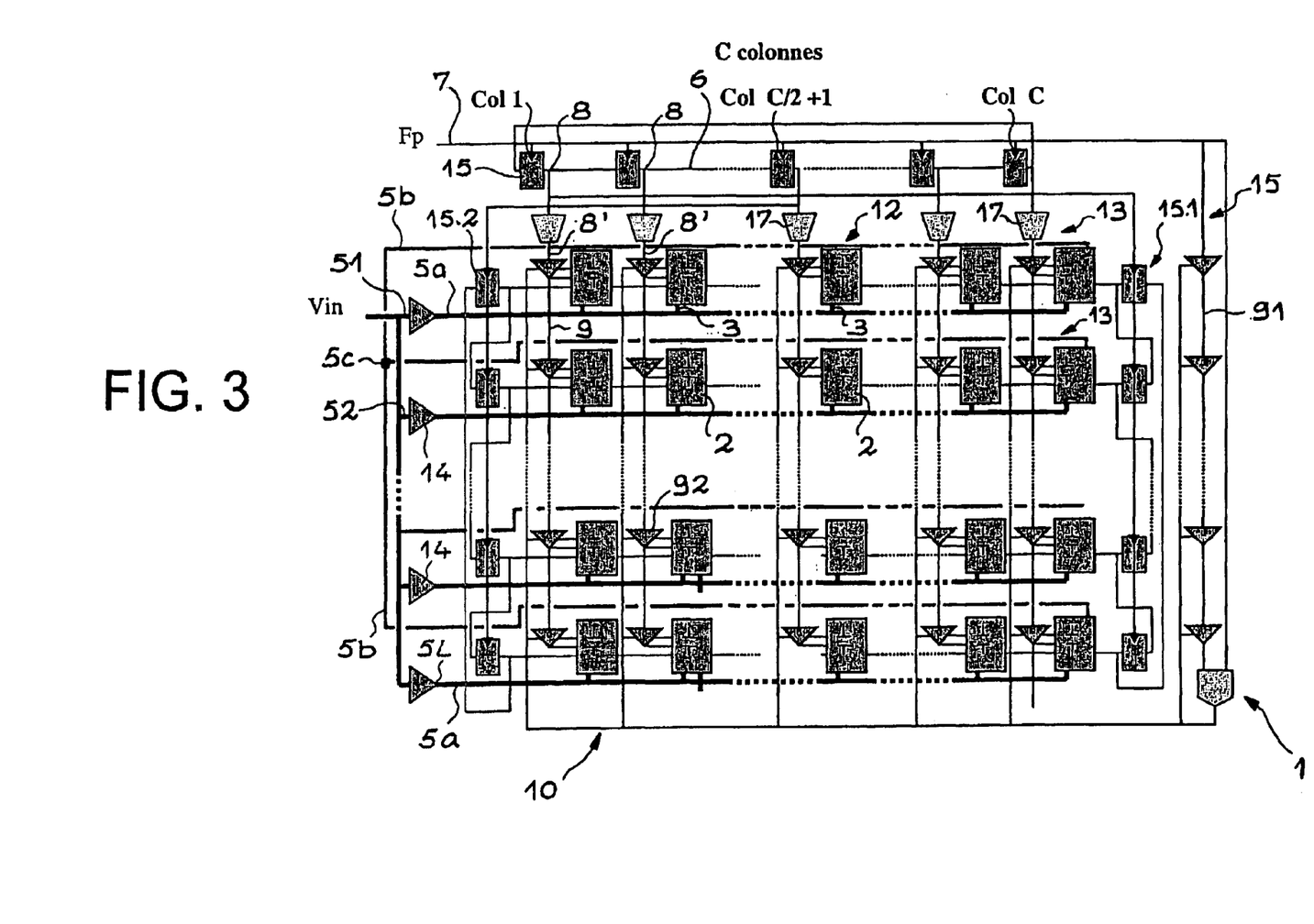
FIG. 3 is a first example of an embodiment of the invention.
Figure 4:
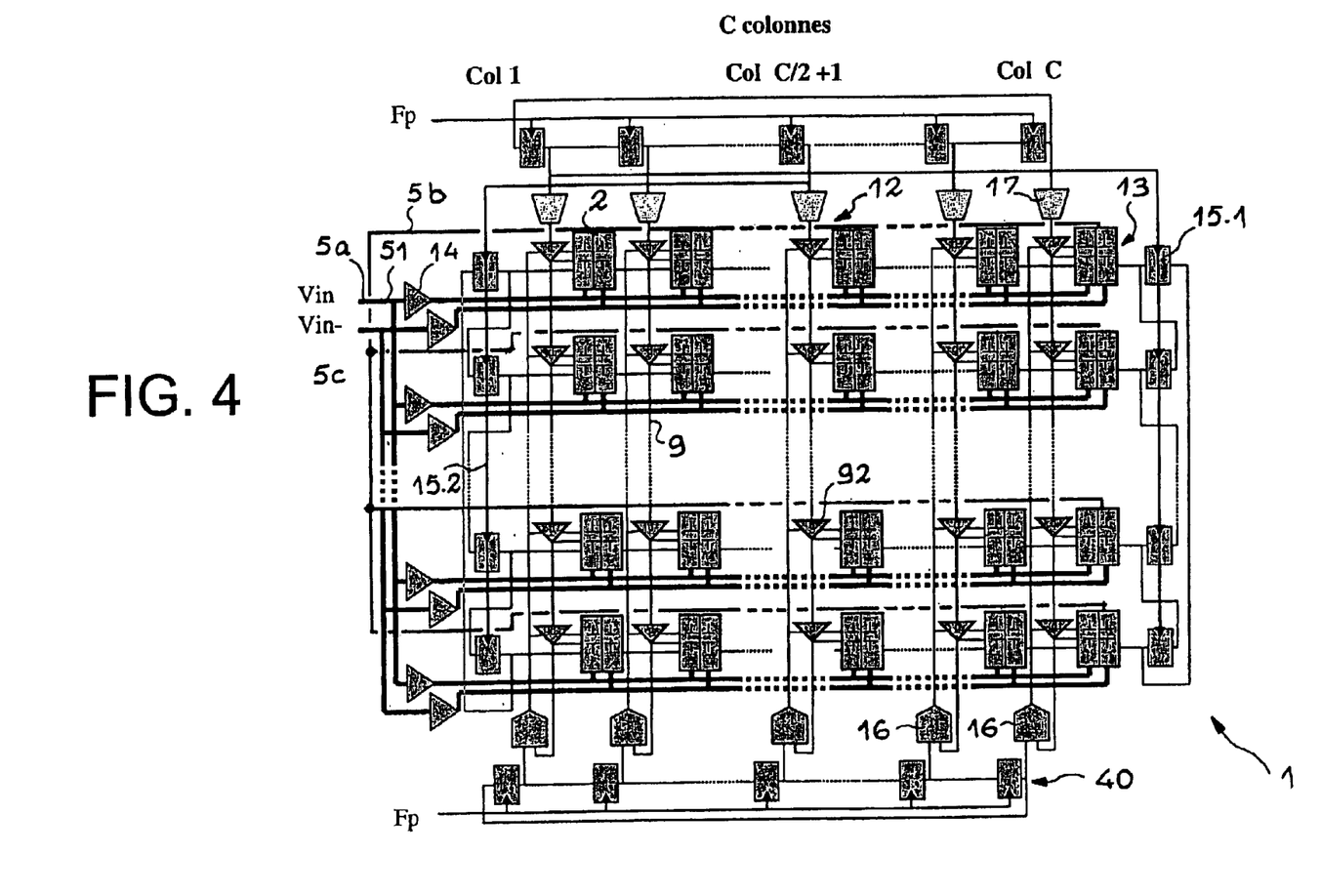
FIG. 4 is a second example of an embodiment of the invention showing in particular an embodiment of the third characteristic in which the number of rows is even with two consecutive lines; the one recording the polarity of the signal to be recorded and the other recording the inverse polarity.

In the embodiments represented in FIGS. 3 and 4, the analog input bus 5 is divided into as many divisions 51, 52 . . . 5L as rows 13 of the matrix array 10. The bus 5 and its divisions comprise a write bus 5a and a return write bus 5b comprising a reference voltage. The return buses 5b of the write signal are connected directly together to a reference input 5c of the input signal.

In the example represented in FIGS. 3 and 4, each of the divisions 51, 52 . . . 5L of the analog bus comprises a self-orienting amplifier 14 (followered called the write amplifier, whose input receives the analog signal to be sampled and whose output is situated upstream of each of the divisions in such a fashion that the cells 2 receive the amplified signal at the output of a self-orienting amplifier 14. Accordingly, the analog signal is buffered from the time of its entry into the circuit by L, or 2L in the case of FIG. 4, wideband self-orienting amplifiers that each drives one division of the upper write bus connected to C memory cells 2. These amplifiers 14 have an excellent pairing in terms of pass-band and signal rise time.

This embodiment has the following advantages:
  permitting any discharge and recharge of the capacitor 22 of each cell via the amplifier 14 over a connection time of the cell to the bus 5 via the switch 21, this connection time capable, for example, of being as great as 1/Fp;
  each of the L divisions of the analog bus 5 is sampled at the maximum the rate of Fp;
  the constraints on the amplifier buffers processing the analog input at the level of each division can be relaxed;
  the duration of the perturbations due to samplings on the write bus can be almost as long as the period of a calibration clock supplying the signal at the rate Fp;
  this makes it possible to obtain a high signal-to-noise ratio, low distortion of the recorded signal and high dynamics.

So that as the path time of the write control signal along a delay line 9 associated with a column 12 is equal to the transit time of the column write signal from an output 8 of the write shift register 6, to the immediately following output, the delay lines 9 are controlled on an ongoing basis. The delay controlling means can be present for each of the C columns of the array 10, as represented in FIG. 4. For this purpose, each of the rows 9 comprises a phase comparator 16 assembly and charge pump making it possible to regulate a polarization voltage of elementary delays together constituting one delay line 9.

The delay controlling means can also be present for only one of the C column of the array. In the case, wherein the control is practiced on one single column serving as the reference column, it is preferable, as shown in FIG. 3, to have a supplementary delay line 91.

This embodiment using a single delay line that serves in controlling each of the other delay lines is more adapted to matrix arrays in which the number of cells is low, in particular the number of cells per column, and wherein the sampling rate is low.

The most detailed structure and the functioning of the regulating means of the travel time of the delay lines 9 will be explained below.

It has been seen hereinbefore that the sampling rate can be regulated to a certain degree by masking rows or parts of rows 13 of the matrix array 10. In order to realize this masking function, each cell 2 is equipped with at least one digital input 11-2 for validation receiving a validation command from a digital validation 15 represented in each of FIGS. 3 and 4. In the example shown in FIGS. 3 and 4, there are in fact two validation registers 15-1 and 15-2 making possible double validation of the cells 2 of a row. The validation registers are connected to a validation word generator (not shown). The structure and function of a validation register 15 in conjunction with the cells 2 of a row are explained in the following, as well as the recommendation to have two registers 15-1 and 15-2 for performing the double evaluation.

In the preferred embodiment shown in FIG. 4 the signal to be recorded is processed in a fashion known per se upstream of the device according to the invention so as, to obtain a bipolar signal. Each of the polarities Vin+ and Vin− of the signal is recorded separately so that a recording of L×C samples of each polarity requires a number of rows equal to 2L.

Optionally, as represented in FIG. 4, the write shift register can be opened up into a write register 6, and a reference register 40. The two registers 6, 40 are identical and receive the same clock signal. The reference register 40 is utilized at the time of writing for controlling the duration of travel of the delay line 9.

The structure and function of the elements that together constitute the matrix array 10 will now be explained.

The structure and the function of a memory cell 2 will now be explained with reference to FIGS. 5 to 7.

Figure 5:
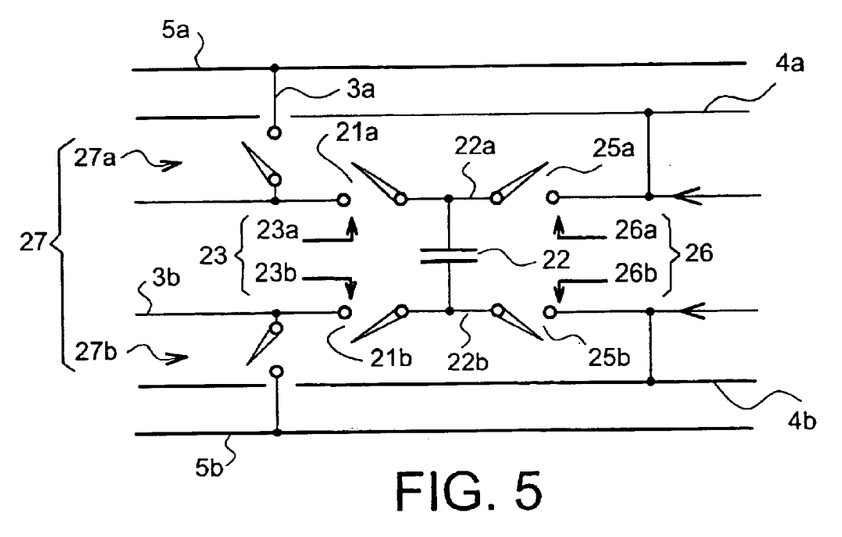
FIG. 5 is a diagrammatic representation of an exemplary embodiment of a recording cell according to the fourth embodiment of the invention.

With reference to FIG. 5, each cell 2 comprises the storage capacitor 22 of a voltage representative of the analog input magnitude. The capacitor 22 has two terminals 22a and 22b. The first switching means 21 are comprised of two parts per two switches 21a and 21b. The terminal 22a is coupled by means of the first part 21a of the first write switching means 21 to the upper part 5a of the analog bus 5. The part of the first part 21a of the first switching means 21 permanently connected to the bus 5a forms a first analog input 3a of the cell 2. The terminal 22a is also coupled by means of a first read switch 25a to the upper part 4a of an analog read bus 4. The terminal 22b is coupled by means of the second part 21b of the first write switching means 21 to the lower part 5b of the analog bus 5. The part of the switch 21b permanently connected to the bus 5b constitutes a second analog input 3b of the cell 2. The terminal 22b is also coupled by means of a second read switch 25b to the lower part 4b of the analog read bus 4. The switches 21a, 21b, and 25a, 25b together comprise, respectively, the write switching means 21 and read switching means 25. Each of the switching means 21, 25 is controlled on opening and closing by the control means 23, 26, respectively. The control means 23, 26 are comprised of a control means 23a, 23b and 26a, 26b, respectively, also symbolized at this stage by arrows 23a, 23b and 26a, 26b controlling, respectively, the switches 21a, 21b and 25a, 25b.

It has been shown hereinbefore that each row may or may not be validated on writing as a function of the desired sampling rate. In a first embodiment the connection between the bus 5 and the capacitor terminals 22 comprises a second switching means 27 comprised of switches 27a, 27b positioned in series, respectively, with the switches 21a and 21b. In this first embodiment, it matters little that the switching means 21, for example, are opened or closed, the signal will not reach the capacitor 22 if the switching means 27 are not also closed. In the second embodiment the validation or inhibition of a row is translated by the fact that the switching control means can close the switching means 21 if the line is validated. In this second embodiment, the validation is assured by a logical circuit connected for receiving the validation control and the write command and delivering a close signal to the switching means 21 only when the two controls, validation and write, are present.

Two exemplary embodiments of the write switching means of their controls and the validation at the level of each cell 2 will now be explained in conjunction with FIG. 6. A first example corresponding to the case, wherein switching means 27 are in series with the switching means 21 is the object of FIG. 6, part A, a second example 21 is the object of FIG. 6, part B.

The write switching means comprise:
the upper write switch 21a CMOS-based transistor, comprising a PMOS transistor and an NMOS transistor connected in parallel by their drain—source path;
the lower write switch 21b based on NMOS transistor.

Figure 6:
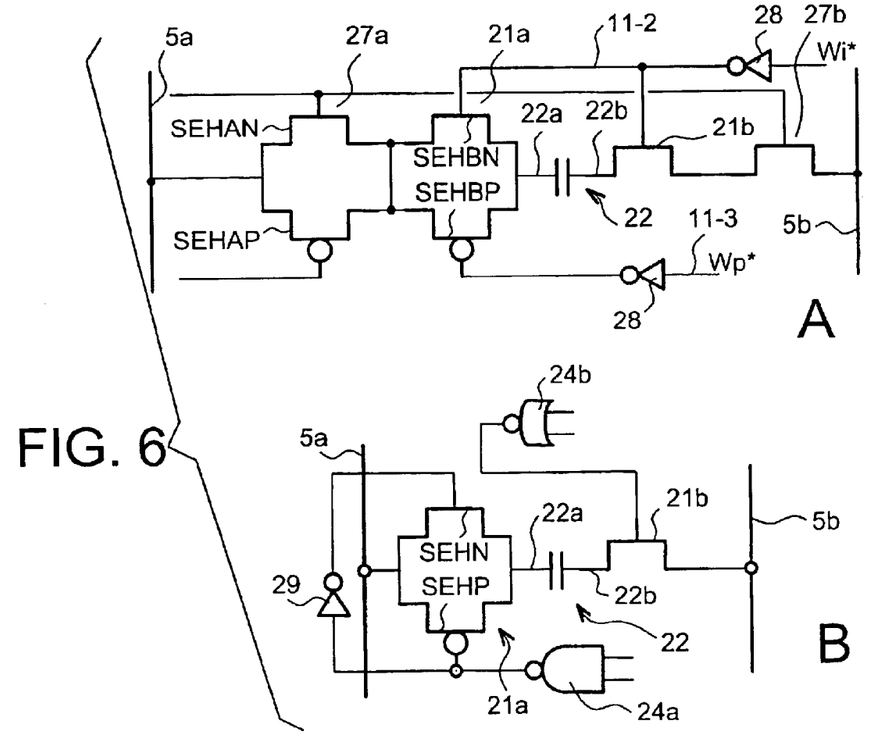
FIG. 6 is a diagrammatic representation of the exemplary realizations of the switching means present in the cell for validating said cell and switching said cell on the bus of data to be recorded. This figure comprises a part A representing a first example and a part B representing a second example.

In the first embodiment represented in part A of FIG. 6, two CMOS switches a first one 21a forming part of the first switching means and a second one 27a forming part of the second switching means are positioned in series between the upper write bus 5a and the terminal 22a of the capacitor 22.

The second CMOS switch 27a is comprised of a transistor NMOS SEHAN, controlled by a validation signal enw (enable writing) applied to the gate of said transistor SEHAN and of a PMOS SEHAP transistor controlled by an enw* validation signal of opposite polarity to the enw signal applied to the gate of said SEHAP transistor. The SEHAN and SEHAP transistors are placed in parallel.

The CMOS switch 21a is comprised of a NMOS transistor, SEHBN, controlled by a write signal wi obtained by inversion of a wi* signal via a first polarity reverser 28 applied to the gate of said SEHBN transistor and a PMOS SEHBP transistor controlled by a wp* signal obtained by reversing the polarity of a wp signal by means of a second polarity reverser 28, applied to the gate of said SEHAP transistor. The SEHBN and SEHBP transistors are placed in parallel.

Each of the switches 21b, 27b is comprised of an NMOS transistor. The second switch 21b of the first switching means 21 is controlled by a write signal wi applied to its gate. The second switch 27b of the second switching means 27 is controlled by the validation signal enw. The two switches 21b and 27b are placed in series between the lower bus 5b and the second terminal 22b of the capacitor 22.

In the second embodiment of the switching control means and the validation control represented in FIG. 6, part B, the switch 21a is formed as in the case described with regard to FIG. 6, part A. The switch 21a comprises two transistors in parallel: one NMOS SEHN transistor and one PMOS SEHP transistor connected in parallel between the upper bus 5a and the first terminal 22a of the capacitor 22. The switch 21b is comprised of a transistor connected between the second terminal 22b of the capacitor 22 and the lower bus 5b. The gate of the SEHN transistor receives via a polarity reverser 29 the output of a reversing AND gate 24a that receives on a first input a signal wp and on a second input a validation signal enw. The gate of the SEHP transistor directly receives the output from the reversing AND gate 24a. The gate of the transistor 21b constituting the switch 21b receives the signal from a reversing AND gate 24b, whose input receives a signal enw* that is opposed by the signal enw and the other input a wi*, formed by a write signal wi.

The signals wi Wi*, Wp, Wp* are write signals coming from the delay line 9 optionally via the polarity reversing devices. The signals enw, enw* are validation signals coming from validation registers that are commented in the following. All of the signals that have just been mentioned are logical signals applied to digital inputs of a cell 2.

In the example represented in FIG. 6, part A, the write digital inputs of a cell 2 are comprised of the controls applied to the gates of the two transistors comprising the switch 21a and the transistor 21b group; that is, a total of three write digital inputs. The write validation inputs are formed by the controls applied to the gates comprising the switch 27a and the gate of the transistor comprising the switch 27b; that is, a total of three validation digital inputs.

In the example represented in FIG. 6, part B, the write digital inputs of a cell 2 are comprised of the controls applied to an input of the gate 24a and the input of the gate 24b; that is, a total of two write digital inputs. The validation inputs are comprised of the controls applied to the other input of each of the gates 24a and 24b.

The operation at this stage for writing only will now be discussed in conjunction with FIG. 7. In the following, it is assumed that the row to which the cell belongs is validated and thus that the writing depends only on the position of the switches 21a and 21b.

Figure 7:
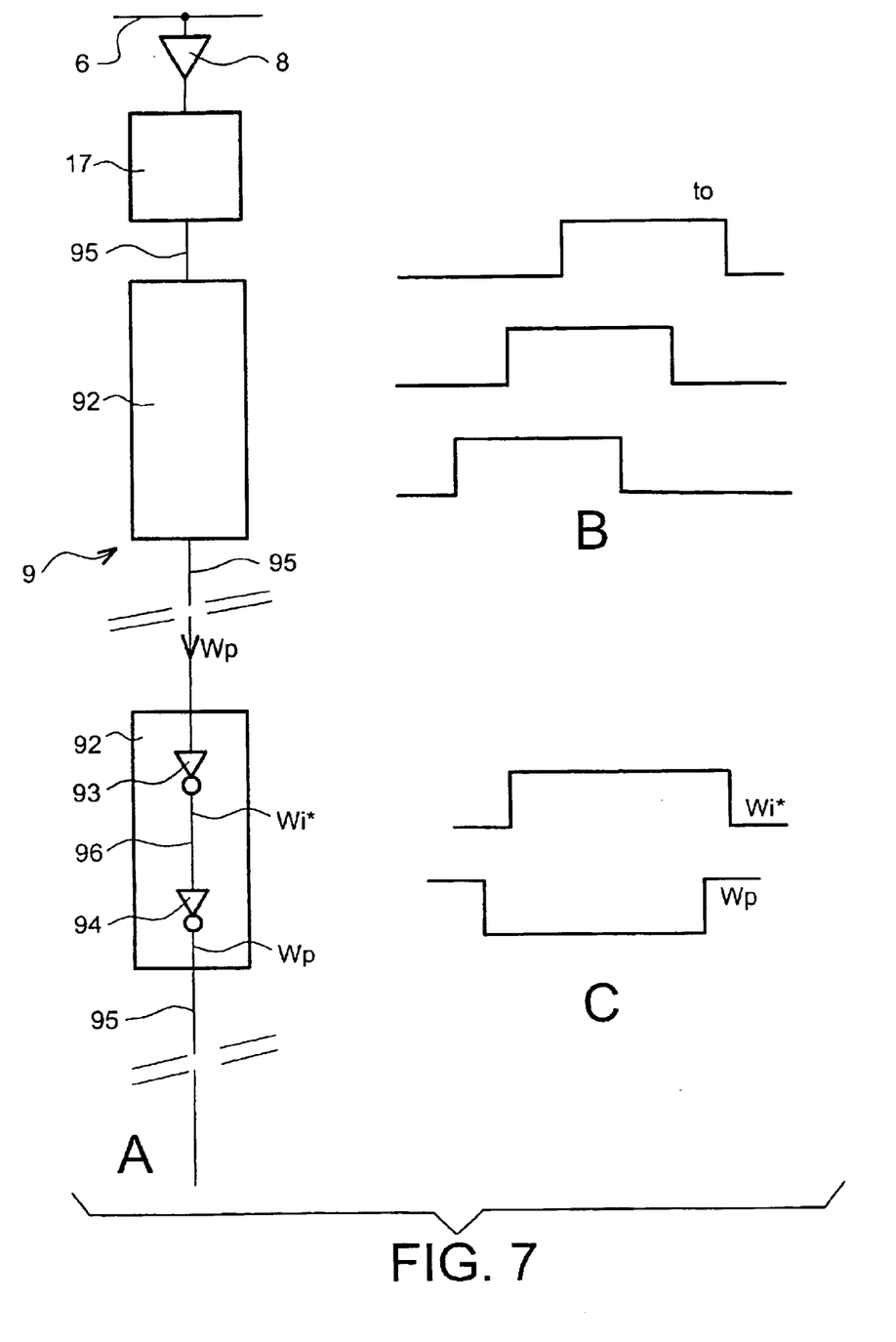
FIG. 7 comprises parts A, B, and C. Part A is a diagrammatic representation of a delay line. Parts B and C represent the signal forms.

The elements necessary for an understanding of the chronology of writing are shown in FIG. 7, part A.

In the present example, the system for generating a write control is comprised of:
the write shift register 6 comprising C outputs 8 corresponding to each of the columns 12;
C formatting blocks referenced using 17 in FIGS. 3 and 4;
C digital delay lines 9 each comprising a number of outputs at least equal to the number of rows; that is, at least L outputs (FIG. 3) and 2L outputs (FIG. 4).

One only of these lines 9 is represented in FIG. 7, part A. The row is comprised of L or 2L elementary delays 92. In an advantageous embodiment each of the elementary delays 92 is comprised of two elementary half-delays 93, 94 arranged in series. This embodiment is represented for only one of the delays 92 in FIG. 7, part A.

In the example represented in FIG. 7, part A, wherein each delay 92 is comprised of two half-delays 93, 94, the number of outputs of the delay line is a multiple, for example in the case represented, of two of the number of elementary delays 92. In the particular exemplary embodiment, each of the half-delays is comprised of a reverser. Accordingly, a signal wp present at the input of a half-delay 92 will have, transformed, a signal wi* after path into the half-delay 93 and after path into the half-delay 94 it will again have a signal wp. The wi and wp signals are logical signals. The shift register 6 for writing columns is timed by the main clock to the main clock frequency Fp. On initialization of the circuit 1, its first cell is set to 1 (PRESET), all others are set to 0 (RESET). A single pulse, called the column pointer, lasting 1/Fp, is propagated along the register at the rate of one output per period 1/Fp.

After (C−1) clock paths, the pulse arrives at the last cell of the register 6. At the following clock path a new pulse will be generated in the first register cell. For this, two solutions can be foreseen:

either by looping the output of the register over the input;

or in making a new reinitialization of the register when a counter, triggered at the time of the previous initialization will have counted C clock paths.

The means and their connection for realizing these functions are known per se and have not been represented, because they are marginal in relation to the invention.

Each of the pulses issued from C cells of the register are then formatted and especially set to the desired duration for the duration of the capture period t0, during which the capacitor 22 is connected simultaneously to the upper bus 5a and to the lower bus 5b. This formatting is done in each block 17 of formatting, for example, by performing a logical AND or an OR of the signal leaving the register 6 with this same signal, whose ascending or descending edge is delayed to arrive at the desired duration.

At the output of each of the formatting blocks 17 the signal is sent into the delay line 9 comprised of L elementary delays 92 in the examples represented in FIGS. 3 and 4, respectively.

These are the signals from each of the elementary delays 92 together constituting the line 9 that comprise the closing and opening control of the switches 21 and 27.

The signals issued from formatting blocks 17 have the form represented in FIG. 7, part B. These are square wave signals having a duration of to. The signal is comprised of a leading edge, of a constant part constituting a high logical state, and then a back edge leading to a low logical state. At each output 95 of an elementary delay 92 of the delay line 9, the signal has the same shape and the same duration but the leading and back edges of the consecutive outputs 95 are shifted relative to each other by the duration of one elementary delay 92 such that the first and the last line of the edges of these signals are increasingly shifted relative to the leading edge of the signal traversing the shift register 6. Three of these signals present at consecutive outputs 95 are represented in FIG. 7, part B. In the simplest embodiment one can conceive that each of the switches 21a and 21b is comprised of a transistor, whose conducting state is controlled by the high logical state of the signal present at each output 95.

One such embodiment has the advantage of simplicity but it has the drawback that becomes apparent when reading the description that follows of a preferred embodiment.

In this preferred embodiment each elementary delay 92 is constituted by two elementary half-delays 93 and 94 arranged in series. Advantageously, each of the delays is comprised of a reverser. The signal present at an intermediate output 96 situated between the two half-delays 92 and 94 has the form and the duration of the signals represented in part B FIG. 7, but the signals present at the intermediate outputs 96 between two intermediate half-delays 92, 94 together forming an elementary delay, have a reversed polarity. These signals are shifted relative to the leading edge of the signal from the shift register 6 by an odd number of half-delays and no longer by a whole number of delays. The signal present at output 95 is itself shifted by a half-delay relative to the first but, moreover, of reverse polarity. One such assembly of two signals is represented in FIG. 7, part C. The signal present at output 96 is called wi*. The signal present at output 95 is called wp.

The write chronology of a sample using switches 21a and 21b as represented in FIG. 6, part A will now be explained.

The output 96 is connected via a reverser 28 at the input of the gate of the NMOS transistor comprising a part of the switch 21a and at the gate of the transistor 21b, respectively. When the signal wi passes to the high logic state, these two transistors are made conducting such that the capacitor 22 is connected between the bus 5a and 5b. The instant of closing occurrs after the back edge of the signal issued from shift register 6, at an instant, whose delay relative to this back edge is a function of the number of elementary delays between the shift writing register 6 of columns and the cell 2. The number of delays corresponds to the number of the row at a half-delay close. These switches 21a and 21b are closed simultaneously and remain closed simultaneously over the period of to corresponding to the duration of the signal wi. During this period to the voltage at the terminals of the capacitor 22 thus follows the voltage difference between the two write buses 5a and 5b. This is a capture phase, during which the voltage at the terminals of the capacitor 22 is set and follows the fluctuations of the signal to be recorded. It will be noted with reference to FIG. 6, part A that it is sufficient that one of the transistors comprising the switch 21a, for example the NMOS transistor, is conducting so that the switch 21a is closed. The second transistor—the PMOS transistor—comprising the switch 21a will be conductively controlled when the signal wp is going to go to the reverse high logic state. This means that this transistor is going to become conducting one elementary half-delay after the NMOS transistor comprising part of the switch 21a, will itself have been made conducting. Similarly, this transistor will become non-conducting a half-delay after the NMOS transistor comprising part of the switch 21a will have itself become non-conducting. This transistor will thus be conducting again at the moment of opening of the NMOS transistors comprising part of the switch 21a and the switch 21b, respectively. This means that the switch 21b is opened before the switch 21a. This is thus the switch 21b that controls the moment of sampling of the signal present on the bus 5, because the charge of the capacitor 22 stops once one of its terminals is disconnected. The voltage on the terminals of the capacitor 22 then memorizes the voltage difference of the two write buses.

The actual sampling being uniquely done by the switch 21b connected to the bus 5b, whose voltage is constant, the instant of sampling as well as the charge injected by the switches are independent of the amplitude of the analog signal memorized.

Another advantage of this embodiment is an NMOS transistor and a PMOS transistor in parallel in order to realize the switch 21a. Because of this assembly, the impedance of the switch 21a is independent to a large degree of the value of the signal to be recorded, which leads to less distortion of the recording.

Thus, according to the embodiment that has been described, the second switch 21b of each cell 2 has its control inputs connected to an elementary delay 92 or elementary half-delay 93 of the delay line 9 that is situated upstream of an output of an elementary delay or elementary half-delay, to which a control input of the first switch 21*a* is connected.

The chronology of operation of the switches in the second embodiment represented in FIG. 6, part B is based on the same principle: the switch 21*b* is closed and is opened a half-delay before the switch 21*a*, of which the two NMOS and PMOS components are simultaneously actuated.

However, the assembly according to said second embodiment is preferred in particular in conjunction with the differential mode of recording shown in FIG. 4, for the ease of implantation in silicon. It will be noted that in this differential embodiment, the odd ranked rows correspond to a first polarity signal and the even ranked rows correspond to a second polarity that is the reverse polarity of the first.

Two solutions for sampling the signal are thus possible: according to a first solution, the even and odd ranked rows are connected from the point of view of the write controls to the same output of the delay line. According to another solution the even ranked rows of a pair are sampled a half-delay after the odd ranked rows of this pair. In order to do this, it is sufficient to connect the control digital inputs for sampling the even rows at an output of a half-delay 93 or 94 of the delay line 9 situated immediately downstream of the output of the half-delay connected to the digital input of sampling the odd ranked row.

In a manner known per se, the polarity reversers for inverting the control signals of the sampling operation for controlling the PMOS and NMOS transistors according to the chronology indicated hereinbefore may be necessary.

Accordingly, on reading the mode of operation described hereinbefore, it can be seen that the method used is a method for capturing analog samples of an analog signal present on an analog bus in cells 2 together forming a matrix array 10 of cells having C columns 12 and L rows 13 or pairs of rows, C and L designating whole numbers, wherein:

a start signal for capturing a sample for a cell is received on a first digital input of said cell;

and in which a sampling end capture signal is received on a second digital entry of said cell, characterized in that, for example, a pulse having an ascending edge and a descending edge is created in the formatting blocks 17 as described hereinbefore and in that:

the signals for the start and for the end of the sampling operation are comprised of ascending or descending edges of said pulse, these edges being received successively over a physically unique digital input, said input being successively the first start control input and the second sampling capture end digital control input.

The duration of the sampling operation is thus determined by the duration of the sampling pulse comprising the ascending and descending edges comprising the control signals for the start and end of the sampling operation. Due to the fact that this pulse is propagated from a current cell to a following cell without deformation via the successive elementary delays 92, the duration of the sampling operation is the same for all of the cells of the matrix array. It is equal to the duration of the pulse.

It has been indicated hereinbefore that the duration of the sum of the individual L delays of the delay line 9 is controlled so that it remains equal to the duration separating two consecutive outputs of the shift register 6 of the write control.

The regulation of the delay contributed by each elementary delay or elementary half-delay can be made in a manner known per se by control of a voltage Vcom. This regulation will now be explained with reference to FIG. 8.

Figure 8:
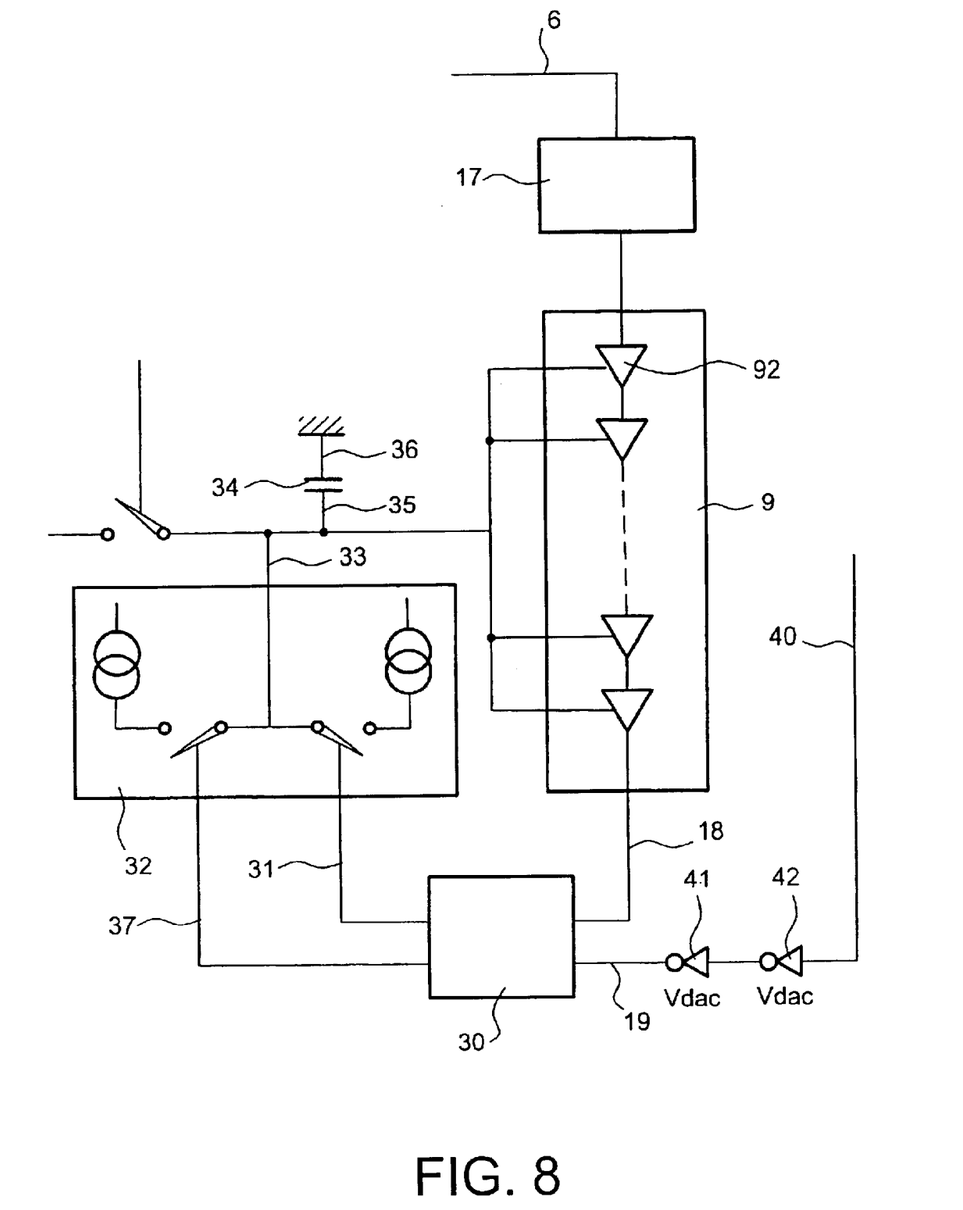
FIG. 8 is a diagrammatic representation of the circuitry controlling the delays of a delay line.

A controlling system makes it possible to fix the target voltage Vcom so that the delay of one cell is equal to $1/(L \times Fp)$. Each column has its own feedback.

Each of the last elementary delays of each delay line 9 is connected to a first input 18 of a phase comparator 30 belonging to said line 9. A second input 19 of the phase comparator 30 is connected to an output of a signal generator from the shift register 40. Outputs 31, 37 of the phase comparator 30 are connected to positive and negative inputs, respectively, of a charge pump 32 known per se comprising a positive current generator and a negative current generator. An output 33 of the charge pump 32 is connected to a terminal 35 of a capacitor 34, whose other terminal 36 is connected to a reference voltage source.

As represented in FIG. 8 the output of the shift register 40 supplying the column 12, whose path time is controlled, is connected to the input 19 of the phase comparator 30 via the two reversers 41, 42.

The operation is as follows:

The phase of the back edge of the signal emitted from the last elementary delay 92 of the delay line 9 of a column 12 is compared in the phase comparator 30 to the back edge of the reference signal from the register 40. If the signal emitted from the last elementary delay 92 of the delay line 9 is in advance relative to the reference signal, the phase comparator 30 activates the charge pump 32 that injects a positive charge proportional to the shift in time in the capacitor 34. The voltage Vcom present on the terminal 35 will increase and consequently the propagation time in the reversers 93, 94 together constituting each of the elementary delays of a delay line 9 will be larger, which will tend to restore to phase the signal emitted by the delay line 9 and the reference signal.

Inversely, if the signal emitted by the last elementary delay 92 of the delay line 9 is delayed relative to the reference signal, the charge pump must inject a negative charge into the capacitor 32 in order to accelerate the transit time in the reversers 92, 93.

Before the comparison, the two reversers 41, 42 at rising edges controlled by an exterior voltage (Vdac) retard the reference signal introduced on the input 19 of the phase comparator 30. The Vdac voltage is set so as to compensate for the delay induced by the formatting block 17. It makes it possible in addition to adjust the delay of the nominal path time of the line 9, for example exactly 20 ns in the example discussed here where the elementary delays 92 of the 20 rows are 1 ns, with considerable precision.

Because of the fact that in the embodiment that has just been described the path time of each column 12 by the pulse, whose rising or descending edges comprise start control signals for the end of capture of the analog signal, is controlled in order to be equal to the duration of the period of clock signal controlling the path from one recording column to the next, it is sure that there is no simultaneous recording of samples or lack of samples at the time of path from one recording column to the next.

The embodiment of the validations will now be explained. It has been seen above that the sampling rate can be reduced by skipping recording rows. A row is necessarily unrecorded if the switches 27*a*, 27*b* of FIG. 6 part A are open or if the AND gates 24*a* or 24*b* do not receive the validation signal over one of their respective inputs. This validation signal makes it possible to validate a row and is received from shift registers 15-1 and 15-2 represented in FIGS. 3 and 4. The shift register 15-1 is coupled to the C/2+1 ranked output of the write shift register 6. The shift register 15-2 is coupled in similar fashion to the first output of the write shift register 6. The shift register 15-1 comprises as many shifted outputs as there are rows. These outputs are coupled to the validation inputs of the cells 2 of the first C/2 columns 12. In the case of a folded recording matrix array as described with reference to FIG. 2, these are columns 12 of even physical ranking; in other words, columns, whose recording path occurs first. Similarly, the shift register 15-2 comprises as many shifted outputs as there are rows. These outputs are coupled to the validation inputs of the cells 2 of the last C/2 columns 12; in other words, columns, whose recording path occurs last. In the case of a folded recording matrix array as described with reference to FIG. 2, these are columns 12 of odd physical ranking. At this point it should be remarked that the ranking of the recording path of the columns does not correspond to their physical ranking. It is also indicated that a validation entry is a digital entry applied to the control of the switches 27 or to an AND gate entry 24 in the case of FIG. 6, part B. Thus, according to this embodiment, it can be said that the device according to the invention has at least one validation shift register for rows having at least as many shifted outputs as rows of the matrix array 10, each of the at least one said validation register having an input coupled to one of the outputs 8 of the write shift register 6, each shifted output of this register being coupled, respectively, to one part at least of the digital entries of the cells 2 of each of the rows 13.

The operation is described as follows:

The registers 15-1 (even physical columns) and 15-2 (odd physical columns) make possible access to the sampling rates between Fp and (L×Fp). These two shift registers of each L shifted outputs make it possible to generate the write enable commands enw and enw*. One output having, for example, a ranking 1 of register 15-1 carries the write enable command enw (1, even) of the C/2 memory cells of the row of ranking 1 belonging to the even columns of this row. Similarly, the output of ranking 1 of the register 15-2 comprises the write enable command enw (1, odd) of the C/2 memory cells belonging to the odd columns of the row of ranking 1 of the matrix array of cells 2.

At the time of initialization of the circuit, the registers 15-1 and 15-2 are both charged with one word of L bits, depending on the selected sampling rate. To this end, each register 15-1 and 15-2 is coupled in a fashion known per se and not represented in FIGS. 3 and 4 to a word generator. This word has the peculiarity of having the same value after a number of shifts equal to the divisor of the maximum authorized rate. The maximum authorized rate depends on the clock frequency and the number of rows as explained above. The authorized division values are the values corresponding to the integer divisors of L; for example, 1, 2, 4, 5, 10, 20 in the case of 20 rows or double rows.

The register 15-1 will receive a command initializing a shift downwards of a validation word when the column pointer of the shift register 6 that determines the recording path of the columns goes to column C/2+1. The register 15-2 will receive, relative thereto, the shift control downwards of the same validation word when the column pointer returns to the first column of the even ranking. The establishment time of the signal emitted by the validation registers can thus be relatively slow (duration<C/(2*Fp), which makes it possible to render it non-perturbing for the analog signal to be recorded.

A table appended to the present description summarizes the initialization values of the registers 15-1 and 15-2 as a function of the desired sampling rate in the case of utilization of a matrix array 10 to 20 rows or double rows and a clock frequency Fp=50 Mhz:

when the rate is maximum, divisor 1, the 20 lines are recorded at maximum rate; for example, 1 Ghz corresponding to 20 times the main clock frequency Fp. All of the rows are validated. The validation word is comprised of 20 high values 1.

When the rate is divided by 2, during a first path only one row out of 2 is recorded. The validation word is comprised of 10 low values 0, alternating with 10 high values 1. On a first path the cells 2 of one out of two rows of each column record an analog value. When the C/2 even columns constituting the columns of the first part of the recording path are recorded, the column pointer of the write shift register 6 reaches the output of the C/2+1 ranking. The shift register 15-1 receives a signal that advances the validation word of an output such that the part of rows comprising the C/2 first columns initially validated by a 1 will be invalidated by a 0 and, in contrast, the parts of lines invalidated by a 0 will be validated by a 1. Accordingly after writing of the C/2 last columns when the column pointer returns to the first column, these are the cells of rows of odd ranking that will be recorded. At the start of recording of the C/2 first columns, the register 15-2 receives the signal from the first write shift register 6 and advances the validation word by one output. The cells of the parts of odd rows of the C/2 last columns are validated when the cells of even ranked rows are invalidated such that when the writing of the C/2+1 ranked column is started, the cells of the parts of rows belonging to odd ranked columns are recorded. The cycle is repeated until recording is stopped by a recording end command that will not be discussed here.

Due to the fact that the validation word has the property of regenerating modulo the divisor of the maximum rate—in the example discussed here after 2 shifts—the recording can continue as long as desired. All of the cells 2 of the matrix array can receive a recording such that whatever the retained authorized divisor, the matrix array can always contain a number of recorded analog values equal to the number of cells of the matrix array. When the divisor is 4, the case of the third line, it will take 4 paths to record all of the cells 2 of the matrix array.

Accordingly, the device according to the invention comprises in this particular embodiment two row validation shift registers 15-1 and 15-2 each having at least as many shifted outputs as lines of the matrix array 10, a first register 15-1 and a second register 15-2, the first register 15-1 having an input coupled to an output of the write shift register 6 having a first ranking of path, the second register 15-2 having an input coupled to a second output of the write shift register 6 having a second ranking of path different from that of the first ranking, the column 12 coupled to the first validation output and the columns coupled to the outputs situated in a recording path between the first validation output and the second validation output together constituting a first part of the matrix array 10, the column 12 coupled to the second validation output and the columns coupled to the outputs situated in the recording path between the second validation output and the first validation output together constituting a second part of the matrix array 10, each output of the first register 15-1 being coupled to a second part of the row belonging to the second part of the matrix array 10 and each of the outputs of the second register 15-2 being coupled to a digital validation input of the cells of a first part of the row belonging to the first part of the matrix array 10.

The mode of operation of validation that has been described corresponds to an analog sample capture method characterized in that a maximum sampling rate is divided by an integer divisor m of the number of rows or pairs of rows L, this rate corresponds to the case, wherein consecutive samples are captured in the capture cells belonging to a same column but situated relative to the consecutive rows or pairs of rows,    a) by enabling sample capture for one cell of a first row of the matrix array;

b) then by invalidating the sampling operation in the (m−1) cells of said column belonging to the rows consecutively following said first row;

c) then by enabling the sampling operation for the $m^{th}$ row following said first row;

d) and by restarting in the same fashion the steps a, b and c for the m rows following this until reaching the last line of the matrix array;

e) by restarting in the same fashion for each of the columns until all of the cells of enabled rows contain samples;

f) by restarting steps a) to e) from a second row of the matrix array, then eventually from a third row and restarting until starting with the $(m-1)^{th}$ row, such that after this last step all of the cells of the matrix array contain an analog sample.

The reading mode of the matrix array is not an object of this invention. It will be briefly discussed below for information purposes. According to what has been discussed above, it is understood that the recording is reproduced indefinitely, the cells already written are re-written after all of the cells have received a recording, the last recordings overwriting the first recordings made (FIFO, first in first out). When the recording stop occurs, the last cell written can be any of the cells of the matrix array. In order to be coherent, it is necessary, when reading, to locate the immediately following cell in the order of writing of the last recorded cell. It is remarked that the column in course of recording at the time of stop is recognized by the state of the write register 6 at the moment of stop of recording. Advantageously, in order to separate reading from writing, the write register 6 is recopied in a read copy register (not shown). A write stop signal STOP controls the stop of the main clock Fp. The main clock stop involves especially a freeze of the write registers 6, the read registers and the validation registers 15-1 and 15-2. The registers so frozen will be acquired at the time of reading of the matrix array in order to make possible the reconstruction of the data. The write stop signal STOP is preferably transformed into a synchronous Fp signal; that is, a predetermined period occurring after a back edge of the Fp signal. The predetermined period will be chosen so that the effective stop of the recording by opening of the switches 21 occurs relative to one cell belonging to a row of predetermined ranking. Thus, knowing the stop column and the stop row, the read start cell is known. Knowing the write order by identification of the validation registers, the read order can be reconstructed. The content of the cells can thus be read column by column by the control of the read switches 25. The analog values are amplified, multiplexed and converted into digital values and stored in a read memory to be read at a rate that can be chosen by the user. The results of reading can be, in a fashion known per se, reordered in the write order and presented on a screen in the form of a curve or in any other form.

APPENDIX

| Sampling Rate | Value of the Rate Divisor and Maximum Rate | Initial Value of the Validation Register (hexa decimal) | Initial Value of the Validation Register (binary) |
| --- | --- | --- | --- |
| 1 GHz | 1 | $FFFFF | 11111111111111111111 |
| 500 MHz | 2 | $55555 | 01010101010101010101 |
| 250 MHz | 4 | $11111 | 00010001000100010001 |
| 200 MHz | 5 | $08421 | 00001000010000100001 |
| 100 MHz | 10 | $00401 | 00000000010000000001 |
| 50 MHz | 20 | $00001 | 00000000000000000001 |

What is claimed is:

1. An analog sampler for recording analog data relative to a signal comprising:

at least one analog bus carrying the signal to be recorded;

a matrix array of capture and recording cells arranged in rows and columns, each of the cells having at least one analog input coupled to at the least one analog bus and at least one digital input, each of the columns having a column input coupled to the digital input of each cell of the column;

a write shift register having an input for receiving a clock signal and a plurality of shifted outputs coupled to the inputs of columns of the matrix array;

wherein for each column an associated delay line having an entry of the delay line and successive shifted outputs in a number equal to or greater than a number of lines of the matrix array is provided, an input of the delay line constituting the column input, the column input being coupled to one of the digital inputs of cells of the column by the delay line, each delay line being formed by a succession of elementary delays, a first delay coupled to a digital input of a cell of a first of the rows, each of following elementary delays coupled biunivocally to a digital input of a cell of one of following lines and a last elementary delay coupled to a digital input of a cell of a last line;

wherein the digital input of a cell coupled biunivocally to one of the elementary delays of the delay line constitutes successively a start and end control input of sampling for the cell.

2. The analog sampler for recording of analog data according to claim 1, comprising at least for one delay line associated with a column or for a supplementary delay line a phase comparator receiving by a first input a signal from the delay line and by a second input a reference signal, one output at least of the phase comparator being coupled to a charge pump, whose one output is coupled to means for controlling a regulating voltage of the elementary delays.

3. The analog sampler for recording analog data according to claim 1, comprising a delay line associated with each column and a phase comparator receiving by a first input the signal from the last delay of the delay line associated with the column and by a second input a reference signal that is an image of the input signal of the delay line associated with the column delayed by a constant duration, a clock period of the write shift register or another shift register receiving a same clock signal as the write shift register, one output at least of a phase comparator being coupled to a charge pump, whose one output is coupled to means for controlling a regulating voltage of the elementary delays.

4. The analog sampler for recording analog data according to claim 1, wherein the outputs of the write shift register are coupled to delay line inputs by formatting blocks of a pulse, the blocks regulating at least a duration of the pulse.

5. The analog sampler for recording analog data according to claim 1, wherein each elementary delay is comprised of first and second elementary half-delays placed in series, each elementary half-delay having a digital output coupled to a digital input of a cell.

6. The analog sampler for recording analog data according to claim 1, wherein the matrix array of recording cells is folded upon itself, the write shift register comprises a 180° bend thus forming an outbound part situated before the bend and a return part situated after the bend, columns and their associated delay lines coupled to outputs of the write shift register situated on the return part being intercalated between the columns and their associated delay lines coupled to outputs of the write shift register situated on the outbound part.

7. The analog sampler for recording analog data according to claim 1, wherein the analog bus is divided for supplying divisions, each division corresponding to a row of the matrix array, and each of the divisions carrying a self-orienting amplifier.

8. The analog sampler for recording analog data according to claim 7, wherein each cell of the array comprises a capacitor having first and second terminals, the first terminal being coupled by a first controllable switch belonging to a first switching means at a division of the bus, the second terminal being coupled to a return part of the bus at constant potential by a second controllable switch belonging to the first switching means, a control of each of these switches being coupled to digital inputs of each of the cells.

9. The analog sampler for recording analog data according to claim 8, wherein the second switch belonging to the first switching means of each cell has its control input connected to an elementary delay or elementary half-delay of the delay line that is situated upstream of an output of an elementary delay or elementary half-delay to which a command input of the first switch belonging to the first switching means is connected.

10. The analog sampler for recording analog data according to claim 8, wherein the first switch belonging to the first switching means is formed by two branched transistors in parallel, of an NMOS transistor and a PMOS transistor.

11. The analog sampler for recording analog data according to claim 1, further comprising at least one line validation shift register having at least as many shifted outputs as rows of the matrix array, each of the at least one validation shift registers having an input coupled to one of the outputs of the write shift register, each shifted output of the at least one line validation shift register being coupled, respectively, to one part at least of the digital inputs of the cells of each of the rows.

12. The analog sampler for recording analog data according to claim 11, comprising first and second line validation shift registers each having at least as many shifted outputs as rows of the matrix array, the first line validation shift register having an input coupled to a first output of the write shift register having a first path ranking, the second line validation shift register having an input coupled to a second output of the write shift register having a second path ranking different from the first ranking, the columns coupled to the first output of the first ranking and the columns coupled to the outputs situated in a recording path between the first validation output and the second validation output together constituting a first part of the matrix array, the columns coupled to the second output of the second ranking and the columns coupled to the outputs situated in the recording path between the second output of the second ranking and the first output of the first ranking together constituting a second part of the matrix array, each output of the first line validation shift register being coupled to a digital validation input of the cells of a second part of the line belonging to the second part of the matrix array and each of the outputs of the second line validation shift register being coupled to a digital validation input of the cells of a first part of the line belonging to the first part of the matrix array.

13. The analog sampler according to claim 11, wherein each line validation shift register has an input that can be coupled to a generator of a validation word.

14. The analog sampler for recording according to claim 1, comprising first and second analog input buses, the first input bus configured to be connected to a source of the signal to be sampled at a first polarity, the second input bus configured to be connected to a polarity inverter receiving the signal to be sampled and supplying a signal to be sampled at a second polarity that is the inverse of the first polarity, the first and second analog input buses being divided to supply the divisions, each division corresponding to a row of the matrix array and each of the divisions having a self-orienting amplifier, the rows being arranged in pairs of rows, each pair of rows comprising one row of the matrix array of odd ranking and one row of the matrix array of even ranking, the rows of one pair having consecutive rankings, each row of odd ranking having its cells coupled to a division of the bus carrying the signal of the first polarity and each even ranked row having its cells coupled to a division of the bus carrying the signal of the second polarity.

15. A method for capturing analog samples of an analog signal present on an analog bus in cells together forming a matrix array of cells having C columns and L rows or pairs of rows, C and L designating integer numbers, each column being comprised by a serial succession of elementary delays having a column input for receiving a pulse having a rising edge and a descending edge, said pulse coming from a shift register controlled by a clock signal, the method comprising:

receiving a sample capture start signal for a cell on a first digital input of the cell;

receiving an end of sample capture signal on a second digital input of the cell;

wherein start and end sampling operation signals are constituted by ascending or descending edges of the pulse, the edges being received successively from one of the elementary delays of the column on a physically unique digital input constituting successively a first digital control start input and a second digital control end of sample capture input, or being received respectively from elementary delays of the column of a first digital control start input and then on a second digital control end of sample capture input.

16. The analog sample capture method according to claim 15, wherein the pulse comprising the ascending and descending edges constituting start and end control signals of the sampling operation is propagated by a current cell to a following cell such that a duration of sampling is a same for all of the cells of a matrix array.

17. The analog sample capture method according to claim 15, wherein a maximum rate of sampling is divided by an integer divisor m of the number of rows or pairs of rows L, the maximum rate corresponding to a case, wherein the consecutive samples are captured in capture cells belonging to a same column but situated on consecutive rows or pairs of rows, a) by enabling sample capture for one cell of a first row of the matrix array;

b) then by invalidating the sampling operation in the (m−1) cells of the column belonging to the rows consecutively following the first row;

c) then enabling the sampling operation for the $m^{th}$ row following the first row;

d) and by restarting in a same fashion operations a), b), and c) for the m following rows until reaching a last line of the matrix array;

e) by restarting in a same fashion for each of the columns until all of the cells of enabled rows contain samples;

f) by restarting operations a) to e) from a second row of the matrix array, then optionally from a third row and by restarting until starting with the $(m-1)^{th}$ row such that after the last operation all of the cells of the matrix array contain an analog sample.

18. The analog sample capture method according to claim 15, wherein on receipt of the end of sampling signal for any cell, first the cell of a row on potential is disconnected from constant potential and then the cell is disconnected from the analog bus carrying the analog signal to be sampled.

* * * * *